(12) United States Patent
Qin et al.

(10) Patent No.: US 10,893,621 B2
(45) Date of Patent: Jan. 12, 2021

(54) DYNAMICALLY BENDABLE DISPLAY DEVICE

(71) Applicant: Wuhan China Star Optoelectronics Semiconductor Display Technology Co., Ltd., Wuhan (CN)

(72) Inventors: Xuesi Qin, Wuhan (CN); Yun Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/493,330

(22) PCT Filed: Jun. 18, 2019

(86) PCT No.: PCT/CN2019/091197
§ 371 (c)(1),
(2) Date: Sep. 12, 2019

(87) PCT Pub. No.: WO2020/113934
PCT Pub. Date: Jun. 11, 2020

(65) Prior Publication Data
US 2020/0221584 A1    Jul. 9, 2020

(30) Foreign Application Priority Data

Dec. 6, 2018    (CN) .......................... 2018 1 1489917

(51) Int. Cl.
*H05K 5/00*    (2006.01)
*H05K 5/02*    (2006.01)

(52) U.S. Cl.
CPC ......... *H05K 5/0017* (2013.01); *H05K 5/0217* (2013.01)

(58) Field of Classification Search
CPC .......................... H05K 5/0017; H05K 5/0217
See application file for complete search history.

(56) References Cited

U.S. PATENT DOCUMENTS

| | | | |
|---|---|---|---|
| 9,471,111 B2* | 10/2016 | Huang | ..... E05D 7/06 |
| 9,811,119 B2* | 11/2017 | Seo | ..... G06F 1/1641 |
| 2010/0157514 A1* | 6/2010 | Johnson | ..... H01L 51/5281 361/679.01 |
| 2015/0176317 A1* | 6/2015 | Lee | ..... E05D 3/06 16/251 |

(Continued)

FOREIGN PATENT DOCUMENTS

| | | |
|---|---|---|
| CN | 204515586 | 7/2015 |
| CN | 104900152 | 9/2015 |

(Continued)

OTHER PUBLICATIONS

English translation of Dou et al. CN106455371 (Year: 2017).*

*Primary Examiner* — Abhishek M Rathod (57) ABSTRACT

A dynamically bendable display device is disclosed. When an external force is being applied, a bending angle of a first screen can be arbitrarily changed, and cylinders after bending are moving to push against each other. When stop applying the external force, a supporting force exists among the cylinders, thereby to enable the first screen to remain still in any state of bending, and to realize dynamically bending of the first screen.

8 Claims, 4 Drawing Sheets

(56) References Cited

U.S. PATENT DOCUMENTS

2015/0255023 A1\* 9/2015 Lee .................. G06F 1/1681
                                            345/204
2016/0230436 A1   8/2016 Ahn
2018/0307338 A1\* 10/2018 Park ................. G06F 1/1681

FOREIGN PATENT DOCUMENTS

| CN | 105869528 | 8/2016 |
| CN | 106455371 | 2/2017 |
| CN | 206210287 | 5/2017 |
| CN | 206505922 | 9/2017 |
| CN | 208185202 | 12/2018 |

\* cited by examiner

DYNAMICALLY BENDABLE DISPLAY DEVICE

RELATED APPLICATIONS

This application is a National Phase of PCT Patent Application No. PCT/CN2019/091197 having International filing date of Jun. 14, 2019, which claims the benefit of priority of Chinese Patent Application No. 201811489917.7 filed on Dec. 6, 2018. The contents of the above applications are all incorporated by reference as if fully set forth herein in their entirety.

FIELD AND BACKGROUND OF THE INVENTION

The present invention relates to a technical field of displays, and particularly to, a dynamically bendable display device.

Flexible organic light-emitting diode (OLED) displays have been gaining attention and are widely recognized as a next generation of mainstream displays. However, OLED panels still have obvious drawbacks, such as a much shorter lifespan than liquid crystal display (LCD) displays, seriously affecting applications of OLED panels.

Currently, OLED displays are still limited to an application of a static bending stage. For example, Samsung now can mass-produce models of S8, S8 plus, and Apple Iphone X, have not achieved real flexibility of OLED displays, at least not yet have reached a level of a mass-production of dynamic bendable flexible OLED screens. Therefore, in the long term, the most promising research trend in displays is still flexible OLED displays.

Figure 1:
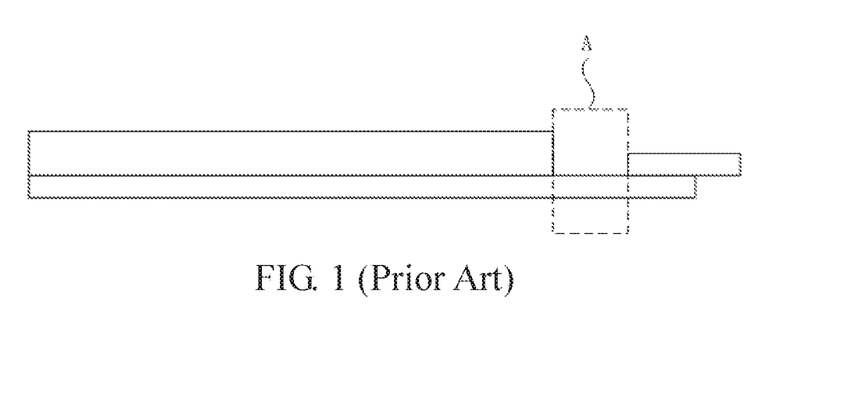
FIG. 1 is a schematic cross-structural view of a conventional static bendable display device.

FIG. 1 is a schematic cross-structural view of a conventional statically bendable display device. Please refer to FIG. 1. The statically bendable display can achieve bending in a bonding area (pad bending) A, realizing a larger screen ratio, but still cannot achieve 100 percent bending. Now Samsung and other companies have proposed a concept of flexible OLED display panels bendable in a small degree, and have a successful experimental result, which is implemented by using more gears, hinges and other components to achieve a flexible bending performance. However, mass production of such models has not been achieved so far, and there is still much room for improvement in a design of dynamic bending areas, requiring further experimental exploration.

In addition, for data statistics, image modification, etc., it is necessary to coordinate connection between different screens as much as possible for a unified contrast of different images of displays, thereby to complete work of statistics and modification. Current display devices require two or more display devices to fulfill the above-mentioned functions, with cumbersome operation and are inconvenient to use.

SUMMARY OF THE INVENTION

An object of the present invention is to provide a dynamically bendable display device capable of realizing a dynamically bending of a display device.

In order to achieve the above-mentioned object, the present invention provides a dynamically bendable display device, comprising a first screen comprising a first display surface and a first connecting end disposed at an edge of the first display surface, a bending area disposed between the first connecting end and the first display surface of the first screen, and a plurality of cylinders arranged in parallel with each other and disposed in the bending area; wherein the plurality of cylinders are enabled to move to push against or spread apart from each other by an external force applied to the first screen, so that the first screen is dynamically bendable, wherein the first screen further comprises a chamber disposed in the bending area, the cylinders are disposed in the chamber and connected to a side wall of the chamber facing the second screen, and the dynamically bendable display device further comprising at least a resilient connecting element, and the resilient connecting element comprising a connecting rod and two enlarged heads disposed at two ends of the connecting rod, respectively, wherein each of the cylinders is a hollow cylinder having at least an opening on a side wall of the cylinder, and the enlarged heads of the resilient connecting element are inserted into the openings of adjacent two of the cylinders.

In one embodiment, the opening has a length greater than a diameter of the connecting rod, so that the resilient connecting element is movable along the opening.

In one embodiment, a gap is formed between adjacent two of the cylinders when the first screen is not bent.

In one embodiment, the dynamically bendable display device further comprises a second screen, wherein the second screen comprises a second display surface and a second connecting end disposed at an edge of the second display surface, the first display surface and the second display surface are disposed corresponding to each other, and the first connecting end is connected to the second connecting end, so that the first screen is bendable with respect to the second screen.

In one embodiment, the first connecting end and the second connecting end are fixed by a connecting structure, wherein an elastic buffer block is disposed between the first connecting end and the second connecting end and is connected to the first connecting end and the second connecting end.

In one embodiment, the connecting structure is a mounting frame mounted to outer peripheries of the first connecting end and the second connecting end, so that the first screen and the second screen are further fixed.

In one embodiment, the mounting frame has a flexible structure, and a protective glue is disposed on an edge of the mounting frame.

In one embodiment, the mounting frame has a flexible structure and edges gradually decreasing in thickness to be curved in shape.

The present invention further provides a dynamically bendable display device, comprising a first screen comprising a first display surface and a first connecting end disposed at an edge of the first display surface, a bending area disposed between the first connecting end and the first display surface of the first screen, and a plurality of cylinders arranged in parallel with each other and disposed in the bending area; wherein the plurality of cylinders are enabled to move to push against or spread apart from each other by an external force applied to the first screen, so that the first screen is dynamically bendable.

In one embodiment, the first screen comprises a chamber disposed in the bending area, and the cylinders are disposed in the chamber.

In one embodiment, the dynamically bendable display device further comprises at least a resilient connecting element, and the resilient connecting element comprising a connecting rod and two enlarged heads disposed at two ends of the connecting rod, respectively, wherein each of the cylinders is a hollow cylinder having at least an opening on a side wall of the cylinder, and the enlarged heads of the resilient connecting element are inserted into the openings of adjacent two of the cylinders.

In one embodiment, the opening has a length greater than a diameter of the connecting rod, so that the resilient connecting element is movable along the opening.

In one embodiment, the cylinders are connected to a side wall of the chamber facing the second screen.

In one embodiment, a gap is formed between adjacent two of the cylinders when the first screen is not bent.

In one embodiment, the dynamically bendable display device further comprises a second screen, wherein the second screen comprises a second display surface and a second connecting end disposed at an edge of the second display surface, the first display surface and the second display surface are disposed corresponding to each other, and the first connecting end is connected to the second connecting end, so that the first screen is bendable with respect to the second screen.

In one embodiment, the first connecting end and the second connecting end are fixed by a connecting structure, wherein an elastic buffer block is disposed between the first connecting end and the second connecting end and is connected to the first connecting end and the second connecting end.

In one embodiment, the connecting structure is a mounting frame mounted to outer peripheries of the first connecting end and the second connecting end, so that the first screen and the second screen are further fixed.

In one embodiment, the mounting frame has a flexible structure, and a protective glue is disposed on an edge of the mounting frame.

In one embodiment, the mounting frame has a flexible structure and edges gradually decreasing in thickness to be curved in shape.

The present invention has advantages as follows: when an external force is being applied, a bending angle of the first screen can be arbitrarily changed, and the cylinders after bending are moving to push against each other. When stop applying the external force, a supporting force exists among the cylinders, thereby to enable the first screen to remain still in any state of bending, and to realize dynamically bending of the first screen.

DESCRIPTION OF PREFERRED SPECIFIC EMBODIMENTS OF THE INVENTION

The following embodiments are referring to the accompanying drawings for exemplifying specific implementable embodiments of a display device of the present invention.

Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

Figure 2:
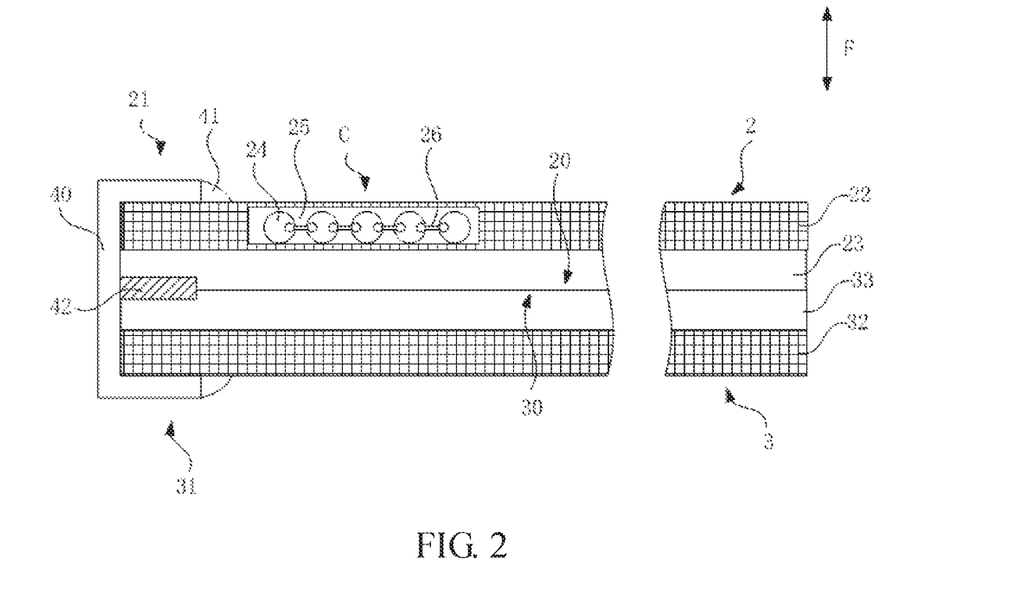
FIG. 2 is a schematic structural view of a dynamically bendable display device of an embodiment of the present invention.
Figure 3:
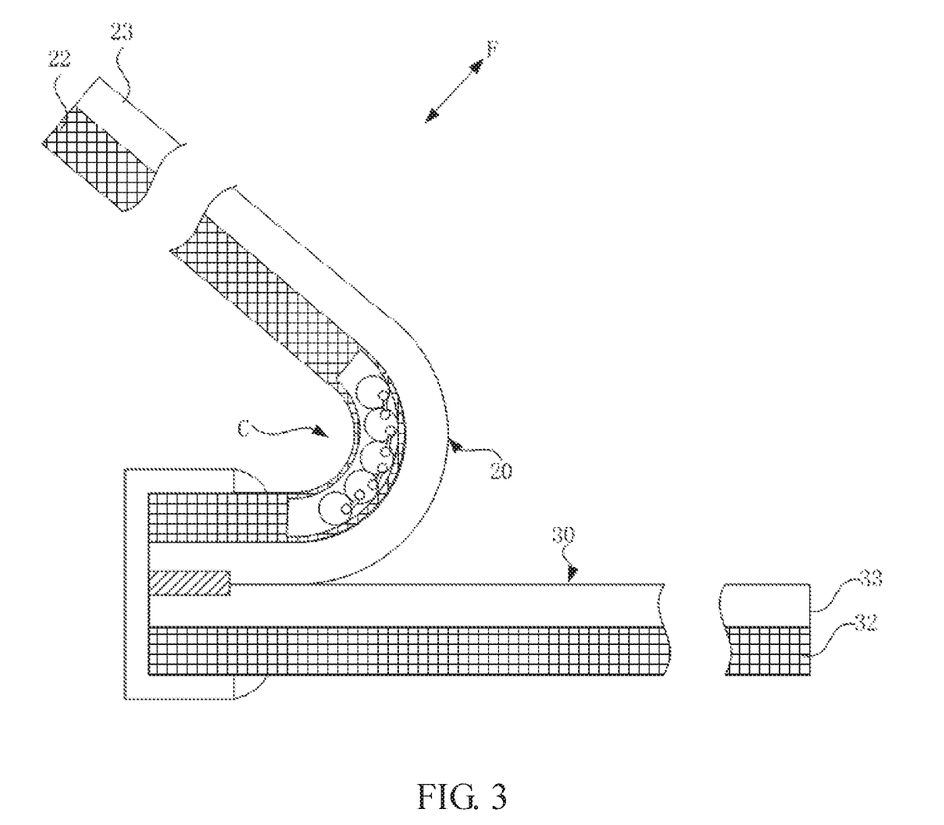
FIG. 3 is a schematic view showing a dynamically bendable display device of an embodiment of the present invention in a bending state.

FIG. 2 is a schematic structural view of a dynamically bendable display device of an embodiment of the present invention. FIG. 3 is a schematic view showing a dynamically bendable display device of an embodiment of the present invention in a bending state. Please refer to FIGS. 2 and 3. The dynamically bendable display device includes a first screen 2. The first screen 2 includes a first display surface 20 and a first connecting end 21. The first screen 2 may be connected to an external device, such as a bottom plate or another screen. In this embodiment, the dynamically bendable display device further includes a second screen 3. The second screen 3 includes a second display surface 30 and a second connecting end 31. The first screen 2 is connected to the second screen 3 to realize dual screen display.

The first connecting end 21 is disposed at an edge of the first display surface 20. Specifically, the first connecting end 21 is disposed on a side of the first display surface 20. The first display surface 20 is configured to display a screen. The first connecting end 21 may be fixedly connected to other structure, such as, in this embodiment, the first connecting end 21 is connected to the second connecting end 31 so that the first screen 2 and the second screen 3 can be correspondingly attached to each other. In this embodiment, the first screen 2 is composed of a first backplate 22 and a first display panel 23, and the first display panel 23 is disposed on the first backplate 22. The first display panel 23 includes but not limited to an organic light-emitting diode (OLED) display panel. The first display panel 23 includes a display area defined as the first display surface 20. An edge of the first backplate 22 and a non-display area on an edge of the first display panel 23 cooperatively form the first connecting end 21.

In this embodiment, the second connecting end 31 is disposed at an edge of the second display surface 30. Specifically, the second connecting end 31 is disposed on a side of the second display surface 30. The second display surface 30 is configured to display a screen. The second connecting end 31 is connected to the first connecting end 21 so that the first screen 2 and the second screen 3 can be correspondingly attached to each other. In this embodiment, the second screen 3 is composed of a second backplate 32 and a second display panel 33, and the second display panel 33 is disposed on the second backplate 32. The second display panel 33 includes but not limited to an OLED display panel. The second display panel 33 includes a display area defined as the second display surface 30. An edge of the second backplate 32 and a non-display area on an edge of the second display panel 33 cooperatively form the second connecting end 31.

The first display surface 20 and the second display surface 30 are correspondingly disposed. Specifically, the first display surface 20 is disposed facing the second display surface 30. In this embodiment, the first display panel 23 and the second display panel 33 are correspondingly disposed and are disposed on inners side of the dynamically bendable display device. The first backplate 22 and the second backplate 32 are disposed on outer sides of the dynamically bendable display device, respectively.

The first screen 2 includes a bending area C disposed between the first connecting end 21 and the first display surface 20. The bending area C is defined as an area about which the first screen 2 is bendable. When an external force F is applied to the first screen 2, the first screen 2 is bendable about the bending area C, wherein the external force F can be applied in a direction perpendicular to the first screen 2. A plurality of cylinders 24 are arranged in parallel with each other and are disposed in the bending area C. Each of the cylinders 24 extends along a bending axis of the bending area C (i.e. a direction perpendicular to a paper, not shown). The cylinders 24 are enabled to move to push against or spread apart from each other by the external force F applied to the first screen 2, so that the first screen 2 is bendable with respect to the second screen 3, thereby to change a relative position of the first display surface 20 and the second display surface 30.

Specifically, when an external force F is applied to the first screen 2 in a direction facing away from the second screen 3, the cylinders 24 are moving toward and squeezed against each other by bending about the bending axis of the bending area C, so that the first screen 2 is bending in a direction away from the second screen 3, thereby to expose the first display surface 20 and the second display surface 30, achieving dual screen display (as a state shown in FIG. 3). When an external force F is applied to the first screen 2 in a direction toward the second screen 3, the cylinders 24 gathering together are spread apart from each other, so that the first screen 2 is bending toward the second screen 3, thereby to fold up the first display surface 20 and the second display surface 30 (as a state shown in FIG. 2).

When the dynamically bendable display device of the present invention is not bent, the cylinders 24 are arranged in parallel, wherein a gap is formed between adjacent two of the cylinders 24. The cylinders 24 are moving to push against each other in conjunction with a bending operation. Since the cylinders 24 are pushed to against each other after bending, a supporting force is provided by each of the cylinders 24 and is applied to the cylinders 24. When the first screen 2 is free of the external force, the cylinders 24 can remain in a current position because of the supporting force among the cylinders 24, and the first screen 2 is still with respect to the second screen 3 until another external force is applied to the first screen 2. Therefore, positions of the first screen 2 and the second screen 3 of the dynamically bendable display device of the present invention can be changed arbitrarily. That is, an angle between the first screen 2 and the second screen 3 can be arbitrarily changed, thereby to realize dynamic bending. In other words, when an external force is being applied, a bending angle of the first screen 2 can be arbitrarily changed, and the cylinders 24 after bending are moving to push against each other. When stop applying the external force, the supporting force exists among the cylinders 24, thereby to enable the first screen 2 to remain still in any state of bending, and to realize dynamically bending of the first screen 2. Furthermore, in the present invention, the second screen 3 may be a non-bendable display screen or a bendable display screen, but is not limited thereto.

Furthermore, the first screen 2 includes a chamber 25 disposed in the bending area C, and the cylinders 24 are disposed in the chamber 25. In this embodiment, the chamber 25 is formed inside the first backplate 22. The first backplate 22 is a flexible bendable backplate and is made of a material including, but is not limited to, polyimide. Further, the first display panel 23 is also a flexible display panel, and the first display panel 23 can also be bent in the bending area C.

Figure 4:
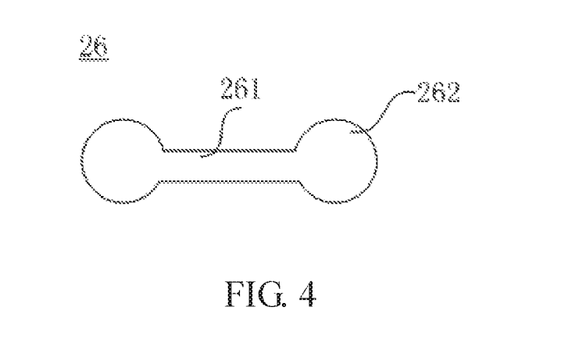
FIG. 4 is a schematic structural view of a resilient connecting element of an embodiment of the present invention.

Further, in this embodiment, the dynamically bendable display device further includes at least a resilient connecting element 26. FIG. 4 is a schematic structural view of the resilient connecting element 26. Please refer to FIG. 4. The resilient connecting element 26 includes a connecting rod 261 and two enlarged heads 262 disposed at two ends of the connecting rod 261, respectively. Specifically, the resilient connecting member 26 has a dumbbell-shaped structure which can be made of a metal or polymer material having resilience.

Figure 5:
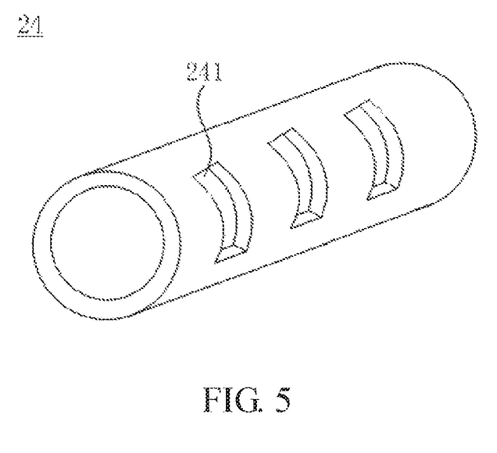
FIG. 5 is a schematic structural view of a cylinder of an embodiment of the present invention.
Figure 6:
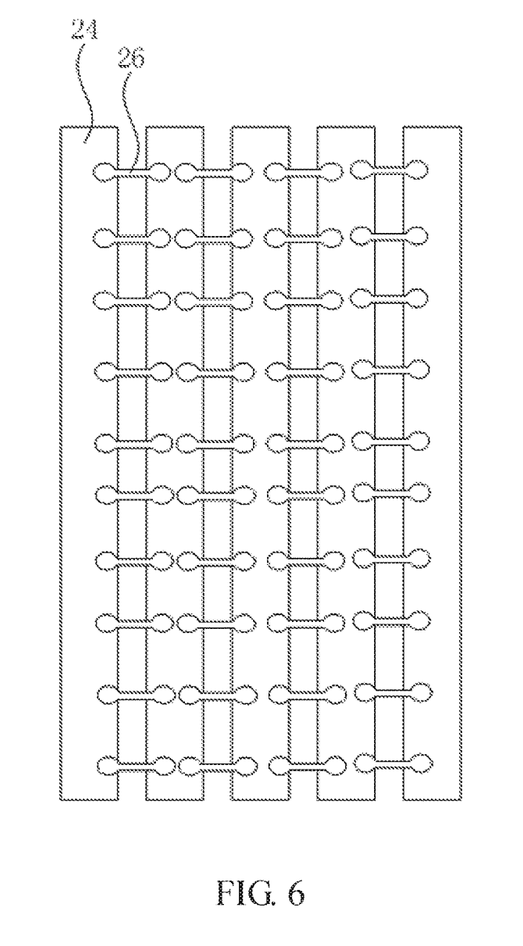
FIG. 6 is a schematic plan view showing a structure that the resilient element is inserted into an opening.

FIG. 5 is a schematic structural view showing one of the cylinders 24. Please refer to FIG. 5. The cylinder 24 is a hollow cylinder having at least an opening 241 on a side wall of the cylinder 24. FIG. 5 schematically shows three the openings 241. In another embodiment, a greater number of the openings 241 can be provided according to an actual application. FIG. 6 is a schematic plan view showing a structure that the resilient elements 26 are inserted into the openings 241. Please refer to FIGS. 2 and 6. The two enlarged heads 262 of the resilient connecting element 26 are inserted into the openings 242 of adjacent two of the cylinders 24. A plurality of the resilient connecting elements 26 are disposed between adjacent tow of the cylinders 24, wherein each of the enlarged heads 262 has a diameter greater than a width of each of the openings 241 to prevent the resilient connecting elements 26 from being separated from the openings 241.

The resilient connecting members 26 exert traction on the cylinders 24. When the first screen 2 is bending with respect to the second screen 3, the cylinders 24 move toward each other, the resilient connecting elements 26 are deformed to apply a pulling force to adjacent two of the cylinders 24 to pull the cylinders 24. The pulling force applied by the resilient connecting elements 26 to the two adjacent cylinders 24 and the supporting force between the two cylinders 24 are cooperatively against gravity of the second screen 3, thereby to enable the first screen 2 to remain still with respect to the second screen 3. Furthermore, the opening 241 has a length greater than a diameter of the connecting rod 261, so that the resilient connecting element 26 is movable along the opening 241, and the first screen 2 can be bending with respect to the second screen 3 at a greater bending degree.

Furthermore, in another embodiment of the present invention, in order to enable the cylinders 24 to be fixed in the chamber 25, the cylinders 24 are connected to a side wall of the chamber 25 facing the second screen 3. Specifically, the cylinders 24 are connected to the side wall of the chamber 25 corresponding to a large bending side of the bending area C, thereby to avoid the cylinders 24 to rotate in the chamber 25, and to carry out traction on the cylinders 24.

Please refer FIG. 2. The first connecting end 21 and the second connecting end 31 are fixed by a connecting structure. In this embodiment, the connecting structure is a mounting frame 40 mounted to outer peripheries of the first connecting end 21 and the second connecting end 31, so that the first screen 2 and the second screen 3 are further fixed. The fixing frame 40 is a flexible fixing frame to avoid damage to the first screen 2 and the second screen 3. Furthermore, a protective glue 41 is disposed on an edge of the mounting frame 40. The protective glue 41 seals a gap between the fixing frame 40 and the first screen 2 and the second screen 3 to serve as a sealing protection, wherein the protective glue 41 includes, but is not limited to, an ultraviolet (UV) curing protective glue. An elastic buffer block 42 is disposed between the first connecting end 21 and the second connecting end 31 to provide a stress buffering function to avoid damage to the first screen 2 and the second screen 3 when bending. Two sides of the elastic buffer block 42 are both connected to the first connecting end 21 and the second connecting end 31 by a bonding structure such as a tape.

Figure 7:
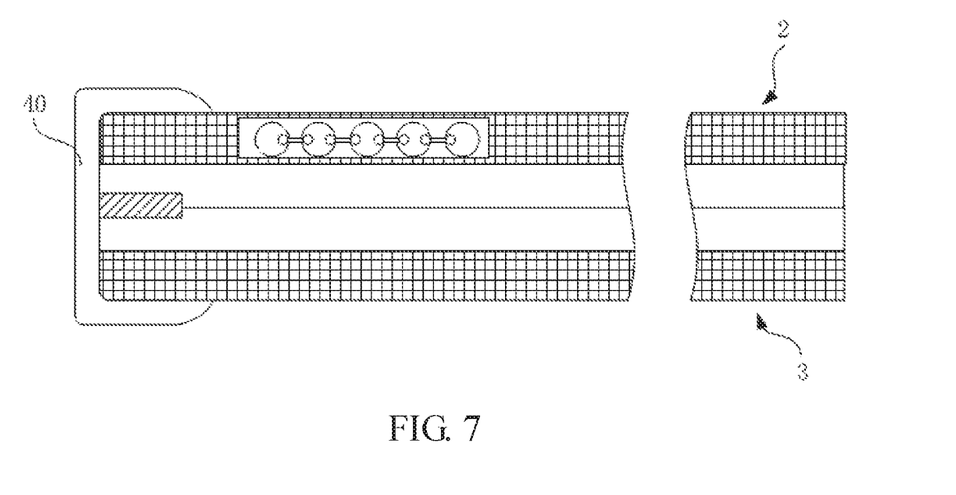
FIG. 7 is a schematic structural view of a dynamically bendable display device of another embodiment of the present invention.

FIG. 7 is a schematic structural view of a dynamically bendable display device of another embodiment of the present invention, wherein FIG. 7 schematically depicts a structure of a connecting end of a first screen 2 and a second screen 3. Please refer to FIG. 7. The difference between this embodiment and the previous embodiment is that in the embodiment, the mounting frame 40 is a flexible structure and the mounting frame 40 has edges gradually decreasing in thickness to be curved in shape, thereby avoiding damage to the first screen 2 and the second screen 3 by sharp corners of the mounting frame 40. In other embodiments of the invention, the connecting components may also be other conventional connecting structures well known to those skilled in the art, such as riveting, threading, or gluing.

The dynamically bendable display device of the present invention can be embodied as a dual screen, wherein one screen, such as a non-bendable screen, can be used as a virtual keyboard, and the other screen is used as a display screen, acting as a laptop, but is lighter than current laptops and is more usable than Ipads. Alternatively, the dual screen can realize a use of comparison of the two-part engineering chart, thereby simply and efficiently addressing engineering technical problems.

The above are only preferable embodiments of the present invention. It is noted that those skilled in the art without departing from the scope of the present invention may make various changes or modifications, and thus the scope of the present invention should be after the appended claims and their equivalents.

The subject matter of the present application is feasible to be manufactured and used in the industry, and thus has the industrial applicability.

What is claimed is:

1. A dynamically bendable display device, comprising:
   a first screen comprising a first display surface and a first connecting end disposed at an edge of the first display surface, a bending area disposed between the first connecting end and the first display surface of the first screen, and a plurality of cylinders arranged in parallel with each other and disposed in the bending area;
   wherein the plurality of cylinders are enabled to move to push against or spread apart from each other by an external force applied to the first screen, so that the first screen is dynamically bendable, wherein the first screen further comprises a chamber disposed in the bending area, the cylinders are disposed in the chamber and connected to a side wall of the chamber facing the second screen, and
   the dynamically bendable display device further comprising at least a resilient connecting element, and the resilient connecting element comprising a connecting rod and two enlarged heads disposed at two ends of the connecting rod, respectively, wherein each of the cylinders is a hollow cylinder having at least an opening on a side wall of the cylinder, and the enlarged heads of the resilient connecting element are inserted into the openings of adjacent two of the cylinders.

2. The dynamically bendable display device of claim 1, wherein the opening has a length greater than a diameter of the connecting rod, so that the resilient connecting element is movable along the opening.

3. The dynamically bendable display device of claim 1, wherein a gap is formed between adjacent two of the cylinders when the first screen is not bent.

4. The dynamically bendable display device of claim 1, further comprising a second screen, wherein the second screen comprises a second display surface and a second connecting end disposed at an edge of the second display surface, the first display surface and the second display surface are disposed corresponding to each other, and the first connecting end is connected to the second connecting end, so that the first screen is bendable with respect to the second screen.

5. The dynamically bendable display device of claim 4, wherein the first connecting end and the second connecting end are fixed by a connecting structure, wherein an elastic buffer block is disposed between the first connecting end and the second connecting end and is connected to the first connecting end and the second connecting end.

6. The dynamically bendable display device of claim 5, wherein the connecting structure is a mounting frame mounted to outer peripheries of the first connecting end and the second connecting end, so that the first screen and the second screen are further fixed.

7. The dynamically bendable display device of claim 6, wherein the mounting frame has a flexible structure, and a protective glue is disposed on an edge of the mounting frame.

8. The dynamically bendable display device of claim 6, wherein the mounting frame has a flexible structure and edges gradually decreasing in thickness to be curved in shape.

* * * * *

UNITED STATES PATENT AND TRADEMARK OFFICE
CERTIFICATE OF CORRECTION

PATENT NO. : 10,893,621 B2
APPLICATION NO. : 16/493330
DATED : January 12, 2021
INVENTOR(S) : Xuesi Qin et al.

It is certified that error appears in the above-identified patent and that said Letters Patent is hereby corrected as shown below:

On the Title Page

Item (22) PCT Filed delete:
"Jun. 18, 2019"
And insert:
--Jun. 14, 2019--

Item (30) Foreign Application Priority Data delete:
"201811489917"
And insert:
--201811489917.7--

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*